(12) United States Patent
Lee et al.

(10) Patent No.: US 10,797,114 B2
(45) Date of Patent: Oct. 6, 2020

(54) ORGANIC LIGHT-EMITTING DISPLAY APPARATUS AND METHOD OF MANUFACTURING THE SAME

(71) Applicant: SAMSUNG DISPLAY CO., LTD., Yongin-si, Gyeonggi-do (KR)

(72) Inventors: Changmin Lee, Yongin-si (KR); Juwon Lee, Yongin-si (KR); Hyomin Ko, Yongin-si (KR); Sanggyun Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/521,133

(22) Filed: Jul. 24, 2019

(65) Prior Publication Data
US 2020/0185462 A1    Jun. 11, 2020

(30) Foreign Application Priority Data

Dec. 5, 2018    (KR) .................. 10-2018-0155458

(51) Int. Cl.
*H01L 27/00*    (2006.01)
*H01L 27/32*    (2006.01)
(Continued)

(52) U.S. Cl.
CPC ...... *H01L 27/3216* (2013.01); *H01L 27/3218* (2013.01); *H01L 51/5036* (2013.01);
(Continued)

(58) Field of Classification Search
CPC ............ H01L 27/3216; H01L 27/3218; H01L 27/322; H01L 27/3211; H01L 27/3246; H01L 27/3213; H01L 51/5036; H01L 51/5056; H01L 51/5072; H01L 51/5206; H01L 51/5221; H01L 51/56
See application file for complete search history.

(56) References Cited

U.S. PATENT DOCUMENTS

| 6,091,382 A * | 7/2000 | Shioya ................ G09G 3/3216 |
| | | 345/76 |
| 8,476,624 B1 | 7/2013 | Wu et al. |

(Continued)

FOREIGN PATENT DOCUMENTS

| KR | 10-0712296 B1 | 4/2007 |
| KR | 10-2009-0002576 A | 1/2009 |
| KR | 10-2014-0034183 A | 3/2014 |

*Primary Examiner* — Nikolay K Yushin
(74) *Attorney, Agent, or Firm* — Lewis Roca Rothgerber Christie LLP

(57) ABSTRACT

An organic light-emitting display apparatus and a method of manufacturing the same are provided. An organic light-emitting display apparatus includes a first light-emitting unit including a first color light-emitting layer on an area of a substrate, a second light-emitting unit including a second color light-emitting layer spaced apart from the first color light-emitting layer, and a third light-emitting unit including a third color light-emitting layer as a common layer corresponding to both areas of the first color light-emitting layer and the second color light-emitting layer, and the first color light-emitting layer includes a lower light-emitting layer and an upper light-emitting layer that are stacked to have a multilayered structure.

20 Claims, 4 Drawing Sheets

(51) Int. Cl.
*H01L 51/50* (2006.01)
*H01L 51/56* (2006.01)
*H01L 51/52* (2006.01)
*H01L 51/00* (2006.01)

(52) U.S. Cl.
CPC ...... *H01L 51/5056* (2013.01); *H01L 51/5072* (2013.01); *H01L 51/5206* (2013.01); *H01L 51/5221* (2013.01); *H01L 51/56* (2013.01)

(56) References Cited

U.S. PATENT DOCUMENTS

| | | |
|---|---|---|
| 9,647,220 B2 * | 5/2017 | Yoshinaga ............ C09K 11/06 |
| 2014/0159023 A1 | 6/2014 | Matsumoto et al. |
| 2016/0276602 A1 * | 9/2016 | Yoshinaga ............ C09K 11/06 |

* cited by examiner

ORGANIC LIGHT-EMITTING DISPLAY APPARATUS AND METHOD OF MANUFACTURING THE SAME

CROSS-REFERENCE TO RELATED APPLICATION

This application claims priority to and the benefit of Korean Patent Application No. 10-2018-0155458, filed on Dec. 5, 2018 in the Korean Intellectual Property Office, the entire disclosure of which is incorporated herein by reference.

BACKGROUND

1. Field

Aspects of one or more embodiments relate to an organic light-emitting display apparatus and a method of manufacturing the same.

2. Description of Related Art

Generally, an organic light-emitting apparatus may implement a color based on a principle in which a hole and an electron are injected by an anode and a cathode, respectively, and then recombined with each other in a light-emitting layer to thereby emit light. Pixels in the organic light-emitting apparatus include an electroluminescence (EL) device in which the light-emitting layer is inserted between an anode electrode and a cathode electrode.

Each of the pixels may be, for example, one among a red pixel, a green pixel, and a blue pixel. A desired color may be represented by combining colors of the pixels of the three colors with each other. That is, each of the pixels has a structure in which a light-emitting layer is arranged between two electrodes (anode/cathode) wherein the light-emitting layer emits light of a color among red, green, and blue. A color of a unit pixel is represented by appropriately combining light of the three colors with each other. However, since a color is implemented by combining pixels of three colors, it is desirable that life span of light emission of pixels of three colors be kept similar to each other to ensure that performance of a product is maintained for a long period of time. Particularly, since life span of light emission of a pixel of blue (B) may be shorter than that of pixels of other colors, when the product is used for a certain period of time, a burn-in phenomenon in which a burning image is present on a screen may easily occur.

In addition, recently, as there has been a demand for a high-resolution product, such as a large TV, a space between pixels has been increasingly reduced. Thus, since there is a concern about a shadow phenomenon, a significant workload may be needed to pattern pixels of three colors. For example, when deposition is performed on a green pixel, a green source needs to adhere only to an inside of an area of the green pixel to form a light-emitting layer. However, the green source may be deposited to an area of a red pixel or a blue pixel adjacent to that of the green pixel and cause a color mixture. This is generally referred to as a shadow phenomenon.

Such a burning image on a screen or a shadow phenomenon may decrease performance and reliability of a product.

SUMMARY

According to aspects of embodiments of the present invention, an organic light-emitting display apparatus in which a color is implemented by combining pixels of three colors of red (R), green (G), and blue (B) with each other, and a method of manufacturing the organic light-emitting display apparatus are provided.

According to aspect of one or more embodiments, an organic light-emitting display apparatus in which generation of a burning image may be suppressed by preventing or reducing early deterioration of a particular pixel and in which a shadow phenomenon may be suppressed, and a method of manufacturing the same, are provided.

Additional aspects will be set forth, in part, in the description which follows and, in part, will be apparent from the description, or may be learned by practice of the presented embodiments.

According to one or more embodiments, an organic light-emitting display apparatus includes a first light-emitting unit including a first color light-emitting layer on an area of a substrate, the first color light-emitting layer to emit light of a first color; a second light-emitting unit including a second color light-emitting layer on the substrate and spaced apart from the first color light-emitting layer, the second color light-emitting layer to emit light of a second color; and a third light-emitting unit including a third color light-emitting layer arranged on the substrate as a common layer corresponding to both areas of the first color light-emitting layer and the second color light-emitting layer, the third color light-emitting layer to emit light of a third color, wherein the first color light-emitting layer includes a lower light-emitting layer and an upper light-emitting layer that are stacked to have a multilayered structure.

The first color may include blue, the second color may include red, and the third color may include green.

The organic light-emitting display apparatus may further include a first charge-providing layer configured to provide holes to a surface of the third color light-emitting layer, and a second charge-providing layer configured to provide electrons to another surface of the third color light-emitting layer.

The organic light-emitting display apparatus may further include an optical resonance layer between the third color light-emitting layer and the first charge-providing layer.

The second color light-emitting layer may share the first charge-providing layer and the second charge-providing layer with the third color light-emitting layer.

The organic light-emitting display apparatus may further include an optical resonance layer between the second color light-emitting layer and the first charge-providing layer.

The lower light-emitting layer of the first color light-emitting layer may share the first charge-providing layer and the second charge-providing layer with the third color light-emitting layer, and the organic light-emitting display apparatus may further include a third charge-providing layer between the second charge-providing layer and the upper light-emitting layer.

The third charge-providing layer may be a composite layer configured to generate and transport holes.

The second charge-providing layer may be a composite layer configured to generate and transport electrons.

The second charge-providing layer may include an electron-generating layer and an electron transport layer spaced apart from each other.

The organic light-emitting display apparatus may further include a first charge-providing layer configured to provide holes to the second color light-emitting layer, the third color light-emitting layer, and the lower light-emitting layer, and a fourth charge-providing layer arranged between the lower light-emitting layer and the upper light-emitting layer and spaced apart from the second color light-emitting layer and the third color light-emitting layer.

The fourth charge-providing layer may include an electron transport layer, an electron-generating layer, a hole-generating layer, and a hole transport layer that are sequentially stacked in a direction from the lower light-emitting layer to the upper light-emitting layer.

The first color light-emitting layer, the second color light-emitting layer, and the third color light-emitting layer may be each arranged between two electrodes, and a distance between two electrodes between which the first color light-emitting layer is arranged may be from about 1750 Å to about 1950 Å, a distance between two electrodes between which the second color light-emitting layer is arranged may be from about 1000 Å to about 1200 Å, and a distance between two electrodes between which the third color light-emitting layer is arranged may be from about 800 Å to about 1000 Å.

The first color light-emitting layer, the second color light-emitting layer, and the third color light-emitting layer may be each arranged between two electrodes, and a distance between two electrodes between which the first color light-emitting layer is arranged may be from about 2900 Å to about 3100 Å, a distance between two electrodes between which the second color light-emitting layer is arranged may be from about 2750 Å to about 2950 Å, and a distance between two electrodes between which the third color light-emitting layer is arranged may be from about 2250 Å to about 2450 Å.

According to one or more embodiments, a method of manufacturing an organic light-emitting display apparatus includes forming a first light-emitting unit including a first color light-emitting layer on an area of a substrate, the first color light-emitting layer to emit light of a first color; forming a second light-emitting unit including a second color light-emitting layer on the substrate and spaced apart from the first color light-emitting layer, the second color light-emitting layer to emit light of a second color; and forming a third light-emitting unit including a third color light-emitting layer that is a common layer arranged on the substrate and corresponding to both areas of the first color light-emitting layer and the second color light-emitting layer, the third color light-emitting layer to emit light of a third color, wherein the first color light-emitting layer includes a lower light-emitting layer and an upper light-emitting layer that are stacked to have a multilayered structure.

The first color may include blue, the second color may include red, and the third color may include green.

The method may further include forming a first charge-providing layer configured to provide a hole to a surface of the third color light-emitting layer, and forming a second charge-providing layer configured to provide electrons to another surface of the third color light-emitting layer.

The second color light-emitting layer may share the first charge-providing layer and the second charge-providing layer with the third color light-emitting layer.

The lower light-emitting layer of the first color light-emitting layer may share the first charge-providing layer and the second charge-providing layer with the third color light-emitting layer, and the method may further include forming a third charge-providing layer between the second charge-providing layer and the upper light-emitting layer.

The method may further include forming a first charge-providing layer configured to provide a hole to the second color light-emitting layer, the third color light-emitting layer, and the lower light-emitting layer, and forming a fourth charge-providing layer between the lower light-emitting layer and the upper light-emitting layer and spaced apart from the second color light-emitting layer and the third color light-emitting layer.

In addition to those described above, other aspects, features and effects will become apparent from the following drawings, claims, and detailed descriptions of the present disclosure.

BRIEF DESCRIPTION OF THE DRAWINGS

These and/or other aspects will become apparent and more readily appreciated from the following description of some embodiments, taken in conjunction with the accompanying drawings, in which.

DETAILED DESCRIPTION

Figure 1:
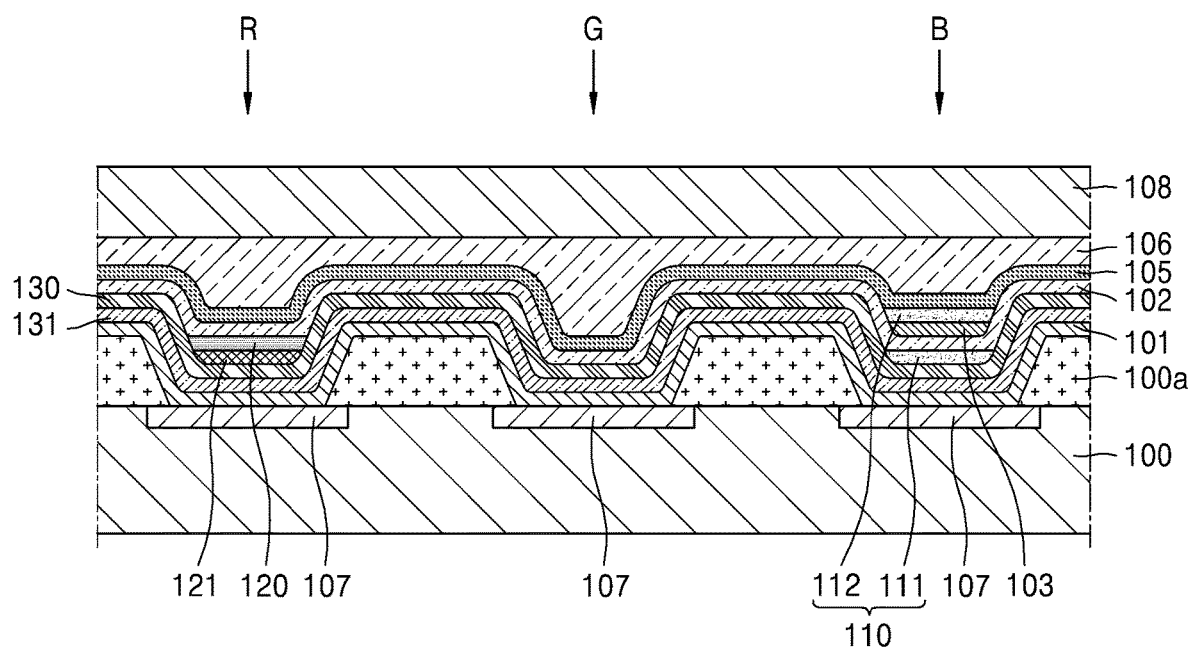
FIG. 1 is a cross-sectional view of an organic light-emitting display apparatus according to an embodiment.

Reference will now be made in further detail to some embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items.

As the present disclosure allows for various changes and numerous embodiments, some particular embodiments will be illustrated in the drawings and described in further detail in the written description. Effects and features of the present disclosure and a method of achieving the same will become apparent to those skilled in the art from the following detailed description which discloses various embodiments in conjunction with the annexed drawings. The present disclosure may, however, be embodied in many different forms and should not be construed as being limited to the embodiments set forth herein.

It is to be understood that although the terms "first," "second," etc. may be used herein to describe various components, these components should not be limited by these terms. These terms are used to distinguish one component from another.

As used herein, the singular forms "a," "an," and "the" are intended to include the plural forms as well, unless the context clearly indicates otherwise.

It is to be further understood that the terms "comprises" and/or "comprising" used herein specify the presence of stated features or components, but do not preclude the presence or addition of one or more other features or components.

Sizes of elements in the drawings may be exaggerated for convenience of explanation. In other words, since sizes and thicknesses of components in the drawings may be arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It is to be understood that when a layer, region, or component is referred to as being "connected to" or "coupled to" another layer, region, or component, it may be directly connected or coupled to the other layer, region, or component, or indirectly connected or coupled to the other layer, region, or component with one or more intervening elements therebetween. For example, when a layer, region, or component is referred to as being electrically "connected to" or "coupled to" another layer, region, or component, it may be electrically directly connected or coupled to the other layer, region, or component, or electrically indirectly connected or coupled to the other layer, region, or component with one or more intervening elements therebetween.

Unless otherwise defined, all terms (including technical and scientific terms) used herein have the same meaning as commonly understood by one of ordinary skill in the art to which example embodiments of the inventive concept belong. It is to be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
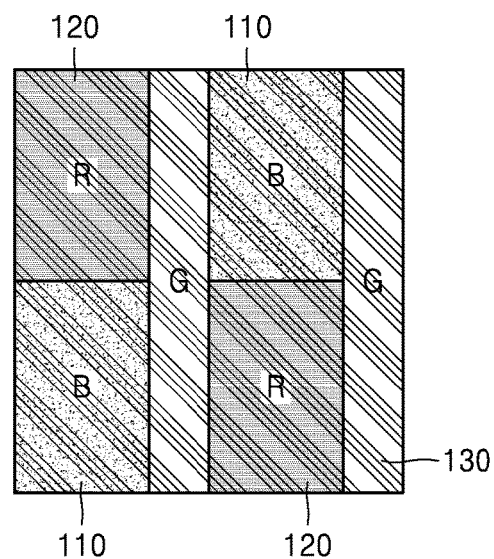
FIG. 2 is a plan view of the organic light-emitting display apparatus of FIG. 1.

FIG. 1 is a cross-sectional view of an organic light-emitting display apparatus according to an embodiment; and FIG. 2 is a plan view of the organic light-emitting display apparatus of FIG. 1.

Referring to FIG. 1, on a substrate 100, first, second, and third light-emitting units B, R, and G are arranged, wherein the first, second, and third light-emitting units B, R, and G are pixels including a blue light-emitting layer 110, a red light-emitting layer 120, and a green light-emitting layer 130, respectively. For convenience of description, herein, blue, red, and green are also referred to as a first color, a second color, and a third color, respectively.

In an embodiment, two main characteristics are such that the blue light-emitting layer 110 is a first color light-emitting layer and has a multiple-layered structure in which a lower light-emitting layer 111 and an upper light-emitting layer 112 are stacked, and that the green-light emitting layer 130 is a third color light-emitting layer and is formed as a common layer including or corresponding to both regions of the blue light-emitting layer 110 and the red light-emitting layer 120 which are first and second color light-emitting layers, respectively.

In an embodiment, by forming the blue light-emitting layer 110 including a multilayered structure, an effective configuration in which a life span of the blue light-emitting layer 110 is extended may be obtained. That is, as described above, since a life span of light emission from the blue light-emitting layer 110 may be shorter than that of light emission of other colors, the life span of the light emission from the blue light-emitting layer 110 may be compensated by forming the blue light-emitting layer 110 to have a multiple-layered structure including the lower light-emitting layer 111 and the upper light-emitting layer 112. Since the lower light-emitting layer 111 is combined with the upper light-emitting layer 112 to thereby emit light with desired brightness, brightness of each of the lower light-emitting layer 111 and the upper light-emitting layer 112 may be kept low compared to a case in which the blue light-emitting layer includes only a single layer. Thus, life span of the blue light-emitting layer 110 may be extended.

In addition, by forming the green light-emitting layer 130 as a common layer including areas of the blue light-emitting layer 110 and the red light-emitting layer 120, an effective configuration may be obtained wherein the effective configuration is such that a shadow phenomenon is suppressed by reducing a number of times patterning is performed. That is, as described above, recently, as there is a demand for high-resolution products, such as large TVs, since a space between light-emitting units may be reduced, there is growing concern about the occurrence of a shadow phenomenon. As described above, when the green light-emitting layer 130 that is the third color light-emitting layer is formed as a common layer that does not need precise mask patterning, only the blue light-emitting layer 110 and the red light-emitting layer 120 may need to be patterned, wherein the blue light-emitting layer 110 and the red light-emitting layer 120 are the first color light-emitting layer and the second color light-emitting layer, respectively. Thus, a risk of color mixture may be reduced.

Accordingly, by using such characteristics, the organic light-emitting display apparatus in which life span may be extended and a shadow may be suppressed may be implemented.

In an embodiment, to facilitate light emission from the organic light-emitting display apparatus with such a structure, a plurality of first, second, third, and fifth charge-providing layers 101, 102, 103, and 105 are arranged between an anode electrode 107 and a cathode electrode 106 of each of the first to third light-emitting units B, R, and G.

A further detailed description of the organic light-emitting display apparatus having such a structure is as follows.

The substrate 100 is schematically illustrated. However, it may be understood that a thin-film transistor (not shown) and a capacitor (not shown) are each connected to the anode electrode 107 and provided in the substrate 100.

A reference numeral 100a denotes a pixel-defining layer and defines light-emitting areas of the first to third light-emitting units B, R, and G. The green light-emitting layer 130 is formed as the common layer. However, like the first and second light-emitting units B and R, light is emitted in an area of the green light-emitting layer 130 overlapping with the anode electrode 107 of the third light-emitting unit G.

On the anode electrodes 107 of the first to third light-emitting units B, R, and G, the first charge-providing layer 101 is arranged. The first charge-providing layer 101 functions as a hole injection and transport layer with respect to each of the blue, red, and green light-emitting layers 110, 120, 130.

In an embodiment, on the first charge-providing layer 101, an optical layer 131 for resonance is arranged as a common layer like the green light-emitting layer 130. The optical layer 131 for resonance may properly adjust a space between the anode electrodes 107 and the cathode electrode 106 to optimize or improve resonance of the third light-emitting unit G. A proper space between the anode electrodes 107 and the cathode electrode 106 will be described later.

On the optical layer 131 for resonance, the green light-emitting layer 130 is formed as a common layer. In the second light-emitting unit R, an optical layer 121 for resonance and the red light-emitting layer 120 are sequentially stacked on the green light-emitting layer 130.

In the first light-emitting unit B, the lower light-emitting layer 111 is formed on the green light-emitting layer 130.

On the lower light-emitting layer 111 of the first light-emitting unit B, the green light-emitting layer 130 of the third light-emitting unit G, and the red light-emitting layer 120 of the second light-emitting unit R, the second charge-providing layer 102 is arranged as a common layer. In an embodiment, the second charge-providing layer 102 has a composite layer in which a material of an n-type electron transport layer is mixed with ytterbium (Yb). The second charge-providing layer 102 generates and transports electrons. That is, since the upper light-emitting layer 112 is arranged above the lower light-emitting layer 111 of the first light-emitting unit B, the lower light-emitting layer 111 of the first light-emitting unit B may not directly contact the cathode electrode 106. Accordingly, the second charge-providing layer 102 configured to generate and transport an electrode is arranged to facilitate supply of electrons to the lower light-emitting layer 111. It may be understood that the red light-emitting layer 120 of the second light-emitting unit R, the green light-emitting layer 130 of the third light-emitting unit G, and the lower light-emitting layer 111 of the first light-emitting unit B share the first and second charge-providing layers 101 and 102.

In addition, in the first light-emitting unit B, the third charge-providing layer 103 and the upper light-emitting layer 112 are sequentially arranged on the second charge-providing layer 102. In an embodiment, the third charge-providing layer 103 also is a composite layer and is configured to generate and transport holes. That is, since the lower light-emitting layer 111 is arranged below the upper light-emitting layer 112, the upper light-emitting layer 112 may not directly contact the anode electrode 107. Accordingly, the third charge-providing layer 103 configured to generate and transport holes is arranged to facilitate supply of holes to the upper light-emitting layer 112.

A reference numeral 105 denotes a fifth charge-providing layer configured to provide electrons to the upper light-emitting layer 112. A reference numeral 108 denotes a protective layer.

Such a structure viewed in a plan view in a downward direction may be shown in FIG. 2. FIG. 2 schematically illustrates arrangement of the first to third color light-emitting layers B, R, and G. FIG. 2 illustrates a structure in which the green light-emitting layer 130 that is a common layer is arranged as a base layer, and the blue light-emitting layer 110 and the red light-emitting layer 120 are arranged in a pentile manner on the green light-emitting layer 130. As described above, in this structure, since precise mask patterning may need to be performed only on the blue light-emitting layer 110 and the red light-emitting layer 120, a risk of color mixture may be greatly reduced.

Figure 5:
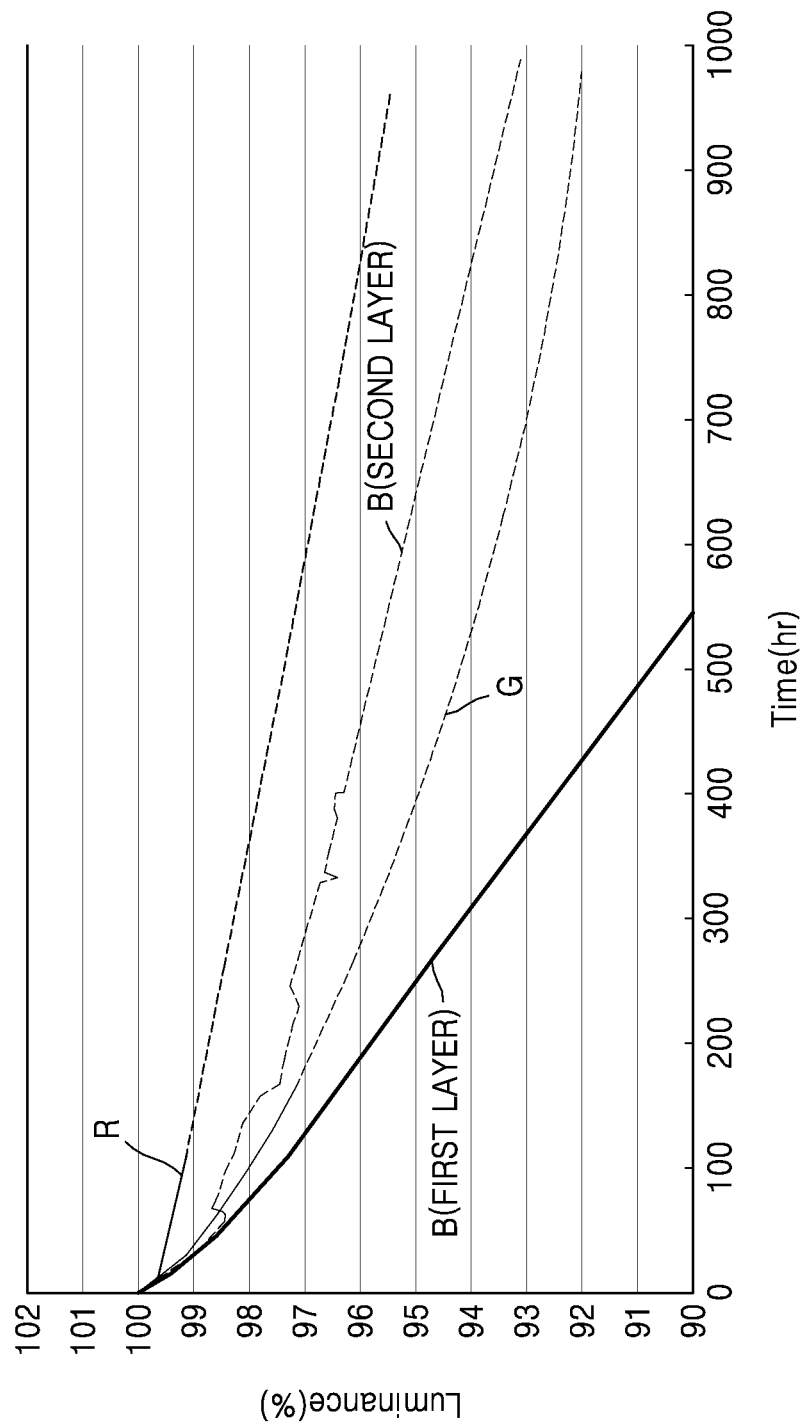
FIG. 5 is a graph showing an effect in which a life span of a blue light-emitting layer is extended in the organic light-emitting display apparatus of FIG. 1.

When an organic light-emitting apparatus having such a structure is used, even though life span of the blue light-emitting layer 110 may be shorter than that of the red and green light-emitting layers 120 and 130, the life span of the blue light-emitting layer 110 may be greatly increased. Then, a burn-in phenomenon may be suppressed wherein the burn-in phenomenon occurs due to short life span of the blue light-emitting layer 110 compared to that of the red light-emitting layer 120 and the green light-emitting layer 130. Thus, a reliability of a product may be greatly enhanced. FIG. 5 is a graph showing an effect in which life span of the blue light-emitting layer 110 is extended. As shown in the drawing, as a period of time in which the blue, red, and green light-emitting layers 110, 120, 130 are used increases, brightness of each of the blue, red, and green light-emitting layers 110, 120, 130 gradually decreases, and, then, life span of the blue, red, and green light-emitting layers 110, 120, and 130 ends. Particularly, like the current embodiment, even though the blue light-emitting layer 110 has short life, when the blue light-emitting layer 110 has a multilayered structure including the upper and lower light-emitting layers 112 and 111, life span of the blue light-emitting layer 110 may be greatly increased and may become greater than that of the green light-emitting layer 130. Thus, it may be understood that the life span of the blue light-emitting layer 110 is not a threshold factor of life.

Accordingly, when the organic light-emitting display apparatus having such a structure is used, early deterioration of a particular pixel may be prevented to thereby suppress generation of a burning image. In addition, since only light-emitting layers of two colors among light-emitting layers of three colors may need to be patterned, a possibility in which a shadow occurs may also be reduced.

In the first to third light-emitting units B, R, and G, light generated from the blue, red, and green light-emitting layers 110, 120, and 130 generate resonance between the anode electrodes 107 and the cathode electrode 106, respectively, to thereby emit light. Optimum luminescence efficiency may be achieved when a resonance order of the first light-emitting unit B is greater than that of the second and third light-emitting units R and G by one resonance order, wherein the first light-emitting unit B employs multiple layers including the upper and lower light-emitting layers 112 and 111. For example, in such a case that the second and third light-emitting units R and G use first resonance, optimum luminescence efficiency may be achieved when the first light-emitting unit B uses first and second resonance. In an embodiment, to do so, a proper range of cavities in the first, second, and third light-emitting units B, R, and G, that is, a proper range of spaces between the anode electrodes 107 and the cathode electrode 106, respectively, may be as follows.

In an embodiment, when a distance between two electrodes such as the cathode electrode 106 and the anode electrode 107 in the first light-emitting unit B of the blue light-emitting layer 110 is in a range from about 1750 Å to about 1950 Å, a distance between two electrodes such as the cathode electrode 106 and the anode electrode 107 in the second light-emitting unit R of the red light-emitting layer 120 is in a range from about 1000 Å to about 1200 Å, and a distance between two electrodes such as the cathode electrode 106 and the anode electrode 107 in the third light-emitting unit G of the green light-emitting layer 130 is in a range from about 800 Å to about 1000 Å, first resonance may be used in the second and third light-emitting units R and G and first and second resonance may be used in the first light-emitting unit B to thereby achieve optimum luminescence efficiency, as described above.

In such a case that the second and third light-emitting units R and G use second resonance, optimum luminescence efficiency may be achieved when the first light-emitting unit B uses second and third resonance. In an embodiment, to do so, a proper range of cavities in the first, second, and third light-emitting units B, R, and G, that is, a proper range of spaces between the anode electrodes 107 and the cathode electrode 106, respectively, may be as follows.

In an embodiment, when a distance between two electrodes such as the cathode electrode 106 and the anode electrode 107 in the first light-emitting unit B of the blue light-emitting layer 110 is in a range from about 2900 Å to about 3100 Å, a distance between two electrodes such as the cathode electrode 106 and the anode electrode 107 in the second light-emitting unit R of the red light-emitting layer 120 is in a range from about 2750 Å to about 2950 Å, and a distance between two electrodes such as the cathode electrode 106 and the anode electrode 107 in the third light-emitting unit G of the green light-emitting layer 130 is in a range from about 2250 Å to about 2450 Å, second resonance may be used in the second and third light-emitting units R and G and second and third resonance may be used in the first light-emitting unit B to thereby achieve optimum luminescence efficiency, as described above.

As a reference, an experiment showed that when a structure includes the blue light-emitting layer 110 having a multilayered structure like the current embodiment, luminescence efficiency of the structure is enhanced to 170% (brightness/input current) relative to that of a structure including a blue light-emitting layer that is a single layer. It was also shown that when an organic light-emitting display apparatus employs the blue light-emitting layer 110 having a multilayered structure, power efficiency (luminescence efficiency/driving voltage) of the organic light-emitting display apparatus greatly increases compared to that of a white organic light-emitting diode (OLED) structure using a color filter.

Figure 3:
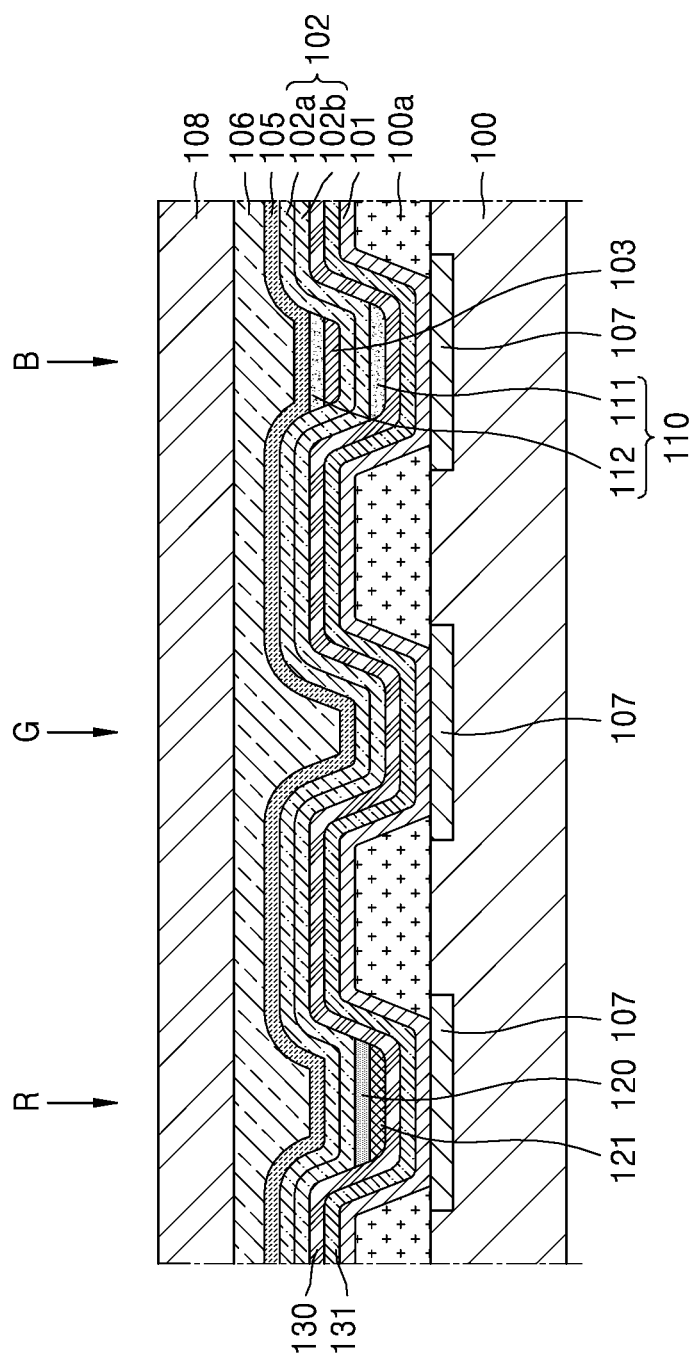
FIG. 3 is a cross-sectional view of an organic light-emitting display apparatus according to another embodiment.

FIG. 3 shows an organic light-emitting display apparatus according to another embodiment.

A structure shown in FIG. 3 is basically the same as that shown in FIG. 1. However, unlike the embodiment described above, the second charge-providing layer 102 is not a composite layer but is divided into multiple layers including an electron-generating layer 102a and an electron transport layer 102b. That is, in an embodiment, the second charge generating layer 102 is not a composite layer configured to generate and transport electrons, but is divided into the electron-generating layer 102a and the electron transport layer 102b to generate electrons and transport electrons, respectively. Other components in the structure may be the same as those described above with reference to the embodiment described above, and, thus, are not described here again. Accordingly, in the structure in the current embodiment, an electron providing layer may be variously modified, generation of a burning image may be suppressed by preventing early deterioration of a particular pixel, and a possibility in which a shadow occurs may be decreased by reducing a number of times patterning is performed.

Figure 4:
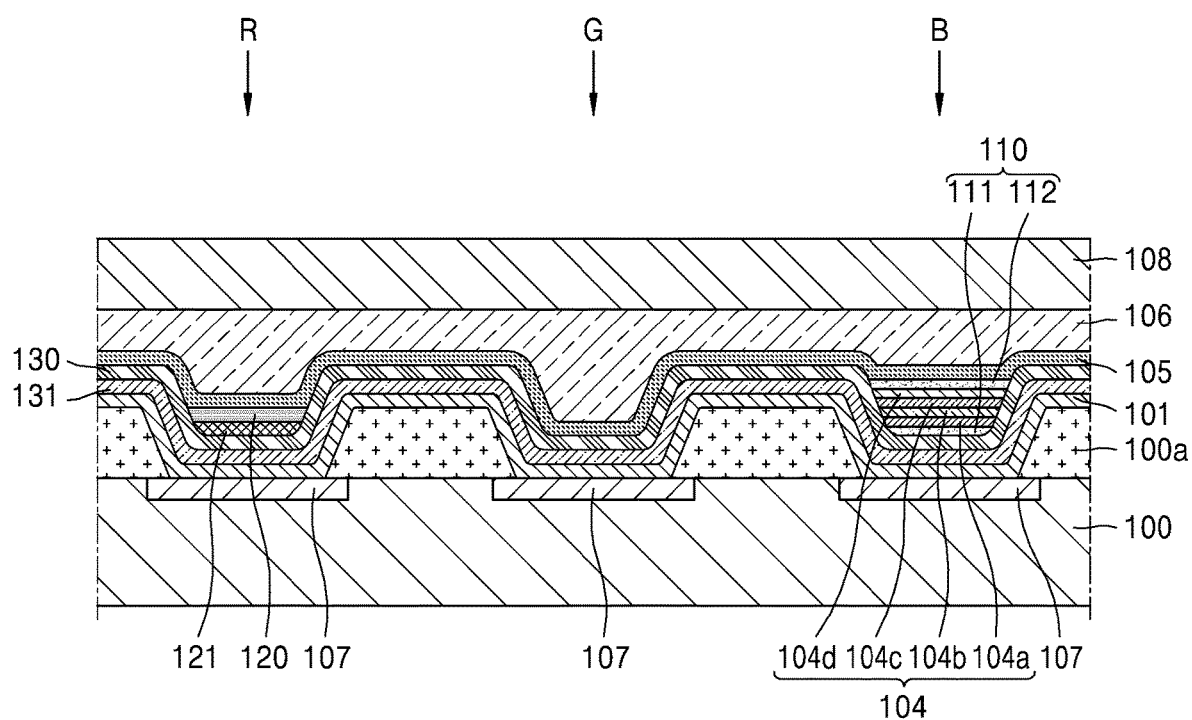
FIG. 4 is a cross-sectional view of an organic light-emitting display apparatus according to another embodiment.

FIG. 4 shows an organic light-emitting display apparatus according to another embodiment.

In the embodiment shown in FIG. 4, the first light-emitting unit B also includes multiple layers including the upper and lower light-emitting layers 112 and 111, and the third light-emitting unit G also includes the green light-emitting layer 130 as a common layer. However, the second charge-providing layer 102 that is a common layer in the embodiment described with reference to FIG. 1 is not provided here. Instead, a fourth charge-providing layer 104 is included only in the first light-emitting unit B. That is, in the second and third light-emitting units R and G, the red light-emitting layer 120 and the green light-emitting layer 130 directly contact the cathode electrode 106 via the fifth charge-providing layer 105. In the first light-emitting unit B, electrons and holes are supplied to the upper and lower light-emitting layers 112 and 111 via the fourth charge-providing layer 104. The fourth charge-providing layer 104 includes an electron transport layer 104a, an electron-generating layer 104b, a hole-generating layer 104c, and a hole transport layer 104d. The electron transport layer 104a and the electron-generating layer 104b provide electrons to the lower light-emitting layer 111, and the hole-generating layer 104c and the hole transport layer 104d provide holes to the upper light-emitting layer 112. That is, in the second and third light-emitting units R and G including a single light-emitting layer, the red light-emitting layer 120 and the green light-emitting layer 130 directly contact the fifth charge-providing layer 105 that is in contact with the cathode electrode 106. Thus, a stack structure in the second and third light-emitting units R and B is simplified. However, since the first light-emitting unit B includes a light-emitting layer having a multilayered structure, the first light-emitting unit B has an intermediate charge-providing layer. Thus, in the first light-emitting unit B, the fourth charge-providing layer 104 is additionally arranged between the upper and lower light-emitting layers 112 and 111 to facilitate supply of holes and electrons to the upper and lower light-emitting layers 112 and 111.

Accordingly, in the structure in the current embodiment, an electron providing layer may be also variously modified, generation of a burning image may be suppressed by preventing early deterioration of a particular pixel, and a possibility in which a shadow occurs may be decreased by reducing a number of times patterning is performed.

In the structures shown in FIGS. 3 and 4, a space between the anode electrodes 107 and the cathode electrode 106 to achieve optimum luminescence efficiency may be the same as that described with reference to FIG. 1. The space between the anode electrodes 107 and the cathode electrode 106 may be set by adjusting thicknesses of the optical layer 121 or 131 for resonance or each of the first to fifth charge-providing layers 101 to 105.

As described above, in an organic light-emitting display apparatus and a method of manufacturing the same according to embodiments, early deterioration of a particular pixel may be prevented to thereby suppress generation of a burning image. In addition, since only light-emitting layers of two colors among light-emitting layers of three colors may need to be patterned, a possibility in which a shadow occurs may be reduced. Accordingly, when the organic light-emitting display apparatus and the method of manufacturing the same are employed, product performance and reliability of the organic light-emitting display apparatus may be greatly enhanced.

It is to be understood that embodiments described herein are to be considered in a descriptive sense and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as set forth in the following claims.

What is claimed is:

1. An organic light-emitting display apparatus comprising:
   a first light-emitting unit comprising a first color light-emitting layer on an area of a substrate, the first color light-emitting layer to emit light of a first color;
   a second light-emitting unit comprising a second color light-emitting layer on the substrate and spaced apart from the first color light-emitting layer, the second color light-emitting layer to emit light of a second color; and a third light-emitting unit comprising a third color light-emitting layer arranged on the substrate as a common layer corresponding to both areas of the first color light-emitting layer and the second color light-emitting layer, the third color light-emitting layer to emit light of a third color different from the first and second colors, wherein the first color light-emitting layer comprises a lower light-emitting layer and an upper light-emitting layer that are stacked to have a multilayered structure and are stacked with the third light-emitting unit arranged as the common layer.

2. The organic light-emitting display apparatus of claim 1, wherein the first color comprises blue, the second color comprises red, and the third color comprises green.

3. The organic light-emitting display apparatus of claim 2, wherein the first color light-emitting layer, the second color light-emitting layer, and the third color light-emitting layer are each arranged between two electrodes, and a distance between two electrodes between which the first color light-emitting layer is arranged is from about 1750 Å to about 1950 Å, a distance between two electrodes between which the second color light-emitting layer is arranged is from about 1000 Å to about 1200 Å, and a distance between two electrodes between which the third color light-emitting layer is arranged is from about 800 Å to about 1000 Å.

4. The organic light-emitting display apparatus of claim 2, wherein the first color light-emitting layer, the second color light-emitting layer, and the third color light-emitting layer are each arranged between two electrodes, and a distance between two electrodes between which the first color light-emitting layer is arranged is from about 2900 Å to about 3100 Å, a distance between two electrodes between which the second color light-emitting layer is arranged is from about 2750 Å to about 2950 Å, and a distance between two electrodes between which the third color light-emitting layer is arranged is from about 2250 Å to about 2450 Å.

5. The organic light-emitting display apparatus of claim 2, further comprising a first charge-providing layer configured to provide holes to the second color light-emitting layer, the third color light-emitting layer, and the lower light-emitting layer, and a fourth charge-providing layer arranged between the lower light-emitting layer and the upper light-emitting layer and spaced apart from the second color light-emitting layer and the third color light-emitting layer.

6. The organic light-emitting display apparatus of claim 5, wherein the fourth charge-providing layer comprises an electron transport layer, an electron-generating layer, a hole-generating layer, and a hole transport layer that are sequentially stacked in a direction from the lower light-emitting layer to the upper light-emitting layer.

7. The organic light-emitting display apparatus of claim 2, further comprising a first charge-providing layer configured to provide holes to a surface of the third color light-emitting layer, and a second charge-providing layer configured to provide electrons to another surface of the third color light-emitting layer.

8. The organic light-emitting display apparatus of claim 7, further comprising an optical resonance layer between the third color light-emitting layer and the first charge-providing layer.

9. The organic light-emitting display apparatus of claim 7, wherein the second charge-providing layer is a composite layer configured to generate and transport electrons.

10. The organic light-emitting display apparatus of claim 7, wherein the second charge-providing layer comprises an electron-generating layer and an electron transport layer spaced apart from each other.

11. The organic light-emitting display apparatus of claim 7, wherein the second color light-emitting layer shares the first charge-providing layer and the second charge-providing layer with the third color light-emitting layer.

12. The organic light-emitting display apparatus of claim 11, further comprising an optical resonance layer between the second color light-emitting layer and the first charge-providing layer.

13. An organic light-emitting display apparatus comprising:

a first light-emitting unit comprising a first color light-emitting layer on an area of a substrate, the first color light-emitting layer to emit light of a first color;

a second light-emitting unit comprising a second color light-emitting layer on the substrate and spaced apart from the first color light-emitting layer, the second color light-emitting layer to emit light of a second color; and a third light-emitting unit comprising a third color light-emitting layer arranged on the substrate as a common layer corresponding to both areas of the first color light-emitting layer and the second color light-emitting layer, the third color light-emitting layer to emit light of a third color;

a first charge-providing layer configured to provide holes to a surface of the third color light-emitting layer, and a second charge-providing layer configured to provide electrons to another surface of the third color light-emitting layer, wherein the first color light-emitting layer comprises a lower light-emitting layer and an upper light-emitting layer that are stacked to have a multilayered structure, wherein the first color comprises blue, the second color comprises red, and the third color comprises green, and wherein the lower light-emitting layer of the first color light-emitting layer shares the first charge-providing layer and the second charge-providing layer with the third color light-emitting layer, and the organic light-emitting display apparatus further comprises a third charge-providing layer between the second charge-providing layer and the upper light-emitting layer.

14. The organic light-emitting display apparatus of claim 13, wherein the third charge-providing layer is a composite layer configured to generate and transport holes.

15. A method of manufacturing an organic light-emitting display apparatus, the method comprising:

forming a first light-emitting unit comprising a first color light-emitting layer on an area of a substrate, the first color light-emitting layer to emit light of a first color;

forming a second light-emitting unit comprising a second color light-emitting layer on the substrate and spaced apart from the first color light-emitting layer, the second color light-emitting layer to emit light of a second color; and forming a third light-emitting unit comprising a third color light-emitting layer that is a common layer arranged on the substrate and corresponding to both areas of the first color light-emitting layer and the second color light-emitting layer, the third color light-emitting layer to emit light of a third color different from the first and second colors, wherein the first color light-emitting layer comprises a lower light-emitting layer and an upper light-emitting layer that are stacked to have a multilayered structure and are stacked with the third light-emitting unit arranged as the common layer.

16. The method of claim 15, wherein the first color comprises blue, the second color comprises red, and the third comprises green.

17. The method of claim 16, further comprising forming a first charge-providing layer configured to provide holes to the second color light-emitting layer, the third color light-emitting layer, and the lower light-emitting layer, and forming a fourth charge-providing layer between the lower light-emitting layer and the upper light-emitting layer and spaced apart from the second color light-emitting layer and the third color light-emitting layer.

18. The method of claim 16, further comprising forming a first charge-providing layer configured to provide holes to a surface of the third color light-emitting layer, and forming a second charge-providing layer configured to provide electrons to another surface of the third color light-emitting layer.

19. The method of claim 18, wherein the second color light-emitting layer shares the first charge-providing layer and the second charge-providing layer with the third color light-emitting layer.

20. The method of claim 18, wherein the lower light-emitting layer of the first color light-emitting layer shares the first charge-providing layer and the second charge-providing layer with the third color light-emitting layer, and the method further comprises forming a third charge-providing layer between the second charge-providing layer and the upper light-emitting layer.

\* \* \* \* \*